United States Patent [19]

Santarelli et al.

[11] Patent Number: 5,123,023
[45] Date of Patent: Jun. 16, 1992

[54] LASER DRIVER WITH PLURAL FEEDBACK LOOPS

[75] Inventors: Bryan A. Santarelli, Haverhill; Marc T. Thompson, Cambridge, both of Mass.

[73] Assignee: Polaroid Corporation, Cambridge, Mass.

[21] Appl. No.: 616,852

[22] Filed: Nov. 21, 1990

[51] Int. Cl.⁵ ............................................. H01S 3/00
[52] U.S. Cl. ...................................... 372/38; 372/32; 372/31; 372/29
[58] Field of Search ..................... 372/29, 32, 31, 38

[56] References Cited

U.S. PATENT DOCUMENTS

| Re. 31,969 | 8/1985 | Sell | 372/38 |
|---|---|---|---|
| 4,237,427 | 12/1980 | Holland | 372/38 |
| 4,339,822 | 7/1982 | Kolodzey | 372/38 |
| 4,400,812 | 8/1983 | Clark et al. | 372/38 |
| 4,504,951 | 3/1985 | MaMahan | 372/38 |
| 4,539,686 | 9/1985 | Bosch | 372/38 |
| 4,592,057 | 5/1986 | Comerford | 372/38 |
| 4,594,717 | 6/1986 | Bracht et al. | 372/38 |
| 4,625,315 | 11/1986 | Lemberger | 372/38 |
| 4,674,093 | 6/1987 | Angerstein | 372/38 |
| 4,677,632 | 6/1987 | Lisco | 372/38 |
| 4,689,795 | 8/1987 | Yoshimoto et al. | 372/38 |
| 4,698,817 | 10/1987 | Burley | 372/31 |
| 4,709,369 | 11/1987 | Howard | 372/38 |
| 4,709,370 | 11/1987 | Bednarz | 372/38 |
| 4,725,854 | 2/1988 | Ohtsuka et al. | 372/29 |
| 4,748,633 | 5/1988 | Negishi | 572/38 |
| 4,761,661 | 8/1988 | NEgishi | 346/108 |
| 4,791,632 | 12/1988 | Anderson et al. | 372/38 |
| 4,817,098 | 3/1989 | Horikawa | 372/29 |
| 4,868,836 | 9/1989 | Howard | 572/38 |
| 4,899,348 | 2/1990 | Kiya et al. | 372/38 |
| 5,018,154 | 5/1991 | Ohashi | 372/29 |

Primary Examiner—Georgia Y. Epps
Attorney, Agent, or Firm—Francis J. Caufield

[57] ABSTRACT

A laser driver circuit pulses of current to a laser diode to activate the diode to emit pulses of radiation suitable for operation of a laser printer. A field-effect transistor (FET) is serially connected with the laser diode and with a feedback resistor for applying the current pulses, the feedback resistor serving as a source of a feedback signal indicative of the magnitude of current flow. A photodetector senses radiation outputted by the laser diode and emits an optical feedback signal representative of radiated power of the laser diode. A combiner circuit, responsive to an input digital command signal, combines the current feedback signal and the optical feedback signal with the command signal to signal generate a drive signal for activating the FET. The combiner circuit includes an input section in which a current source powers a differential amplifier operating in a switching mode in response to the command signal, a drive section wherein a current source powers a differential amplifier operating in a linear mode and connecting between the input section and the FET, and a threshold section connected to the input section for establishing a threshold current level in the drive signal which activates the FET.

16 Claims, 2 Drawing Sheets

LASER DRIVER WITH PLURAL FEEDBACK LOOPS

This application is related to U.S. patent application Ser. Nos. 616,633, 616,880, and 616,417 filed on the same date herewith and commonly assigned.

BACKGROUND OF THE INVENTION

This invention relates to driver circuits for lasers suitable for use in a laser printing system and, more particularly, to the use of dual feedback loops for controlling current pulses applied to a laser diode, the invention including circuitry for isolating the driver form changes in the amplitude of a digital input signal and for introducing a threshold current to a laser drive signal.

The use of a laser, in the form of a diode, as the source of radiation in a laser printing system has found wide acceptance in printing systems, including laser printers used as an output device of a computer and in facsimile machines. Typically, the radiation, or light, of the laser is scanned across a photosensitive material which serves as a recording medium for recording data. The scanning of the light across the photosensitive material is accomplished, in some equipment, by a moving optical element providing an optical scan of the beam. in other equipment, the scanning is accomplished by introducing relative motion between the photosensitive material and a print heat incorporating the laser. It is also common practice to include both optical and mechanical scanning of the laser beam in a printing apparatus.

Of particular concern herein is the use of a laser diode for producing a digitally modulated laser beam suitable for use in a printing system wherein the image on the photosensitive medium is composed of an array of light and dark spots which appear to the human eye as alphanumeric symbols or gray-scale pictorial data. Typically, the imprinted data to such a print system is in the form of a digital command signal provided by a character generator or other source of data, the command signal designating the intervals of time over which the laser is turned on at sufficient intensity to place a mark on the recording medium and those intervals of time when the intense radiation of the laser is to be extinguished or to be reduced to a sufficiently low intensity having essentially no effect upon the recording medium.

To optimize the operation of such a print system, it is desirable to sense the actual value of current flowing through the laser diode in response to the digital command signal so as to ensure an accurate production of laser radiation, or light, of the desired intensity. This assures uniformity in creating an image on the recording medium. A further improvement in the uniformity of the image is attained by sensing the intensity of light produced by the laser, this being useful to counteract any effect of drift in the laser characteristics of light output versus drive current. Yet a further consideration in the operation of the laser diode concerns the extent to which the laser drive current is to be terminated between pulses of radiation for facilitating the activating and deactivating of the laser. It is also important to operate the laser in a manner which enhances high-speed production of light pulses because a high-speed pulse train can increase the throughput rate of the print system, or alternatively, can provide a higher resolution image with more pixels per inch at a given throughput rate.

Consequently, it is an object of this invention to provide a laser drive which optimizes the use of all of the foregoing parameters for enhancing image quality, both in terms of image intensity and image resolution.

SUMMARY OF THE INVENTION

The aforementioned object is achieved and other advantages are provided by a circuit for driving a laser, preferably a semiconductor laser diode, for producing pulses of radiation, or light, suitable for use in a printer. In practicing the invention, a signal is outputted from a source of data in digital format to serve as the command signal for activating and deactivating the laser to produce flashes of light. The duration of each pulse may vary, and the spacings between pulses may vary in accordance with the intervals of time in which lasing action is initiated and in which lasing action is terminated, respectively. To assure accuracy of the intensity of light pulses, in terms of both short term accuracy such as a single pixel or line scan, and long term accuracy, such as in different parts of an image as well as between images produced at different times, the circuitry of the invention isolates the drive circuit from changes in and a combination of the command signal with two feedback signals provides for accurate regulation of the drive current applied to the laser. Also, the invention provides for the combination of a threshold current with the commanded current pulses to optimize transitions in the laser diode between on and off states of radiation. During the off state, the laser radiation preferably is not turned completely off but, rather, is reduced to a threshold value of radiation which is insufficient to produce a mark on a photosensitive recording medium.

The laser is energized with pulses of current provided by a field-effect transistor (FET) serially connected to it, there being a feedback, or current-sensing, resistor in series with the FET and the laser for sensing current flow in the laser. One of the feedback signals is a current feedback signal generated by a voltage drop across the feedback resistor. The second of the two feed back signals is an optical feedback signal obtained by sensing the intensity of light radiated by the laser by use of a photodetector. The combination of the two feedback signals with the command signal, as well as the combination of a threshold signal with the command signal, is accomplished by a signal combiner circuit which includes an input section and a driver section activated by the input section. Both of these sections are constructed of similar circuitry, namely a differential amplifier having two branches energized with current from a current source.

In the input section of the signal combiner, the differential amplifier is operated in a switching mode, while in the driver section, the differential amplifier is operated in a linear mode. The optical feedback signal is applied to the current source of the input section for designating the amount of current to be applied by the source to the differential amplifier. The digital command signal is applied to a first branch of the differential amplifier of the input section, and a temperature-compensated threshold signal generator produces a threshold signal which is summed with the command signal in the second branch of the differential amplifier of the input section.

The second branch of the differential amplifier of the input section of the signal combiner applies the sum of the digital command signal plus the threshold signal to the first branch of the differential amplifier of the driver section. The current source of the driver section operates at a fixed value of current which splits between the two branches of the differential amplifier. In the second branch of the differential amplifier of the driver section, the current feedback signal is combined with the sum of the command signal plus the threshold signal to produce a laser drive signal which is outputted via a power amplifier to the FET. The power amplifier has sufficient current to rapidly charge input capacitance of the FET to accomplish a rapid rise time in the generation of current pulses at the FET for activating the laser.

Connection of the digital command signal to a branch of the differential amplifier operating in a switching mode provides for a generation at the differential amplifier of a sequence of pulses having uniform amplitude substantially independent of any amplitude variation in pulses of the digital command signal. The mode of coupling of the optical feedback signal and the mode of coupling of the threshold signal in the input section provides for a linear combination of these signals with the command signal. Also, the subsequent combination of these signals with the current feedback signal in the driver section is a linear operation. Thereby, the pulses of light emitted by the laser are precisely controlled for uniform intensity of points of an image produced by a printing system. The use of the FET to provide relatively large pulses of current to the laser and the use of a fast-response high-powered amplifier to connect the laser drive signal to the FET provides for increased speed and accuracy in the generation of the pulses of laser radiation. This enables a higher throughput rate of the printing system and/or a higher resolution and improved gray scale capabilities to the image produced in a photosensitive recording medium.

BRIEF DESCRIPTION OF THE DRAWING

The aforementioned aspects and other features of the invention are explained in the following description, taken in connection with the accompanying drawing wherein.

DETAILED DESCRIPTION

Figure 1:
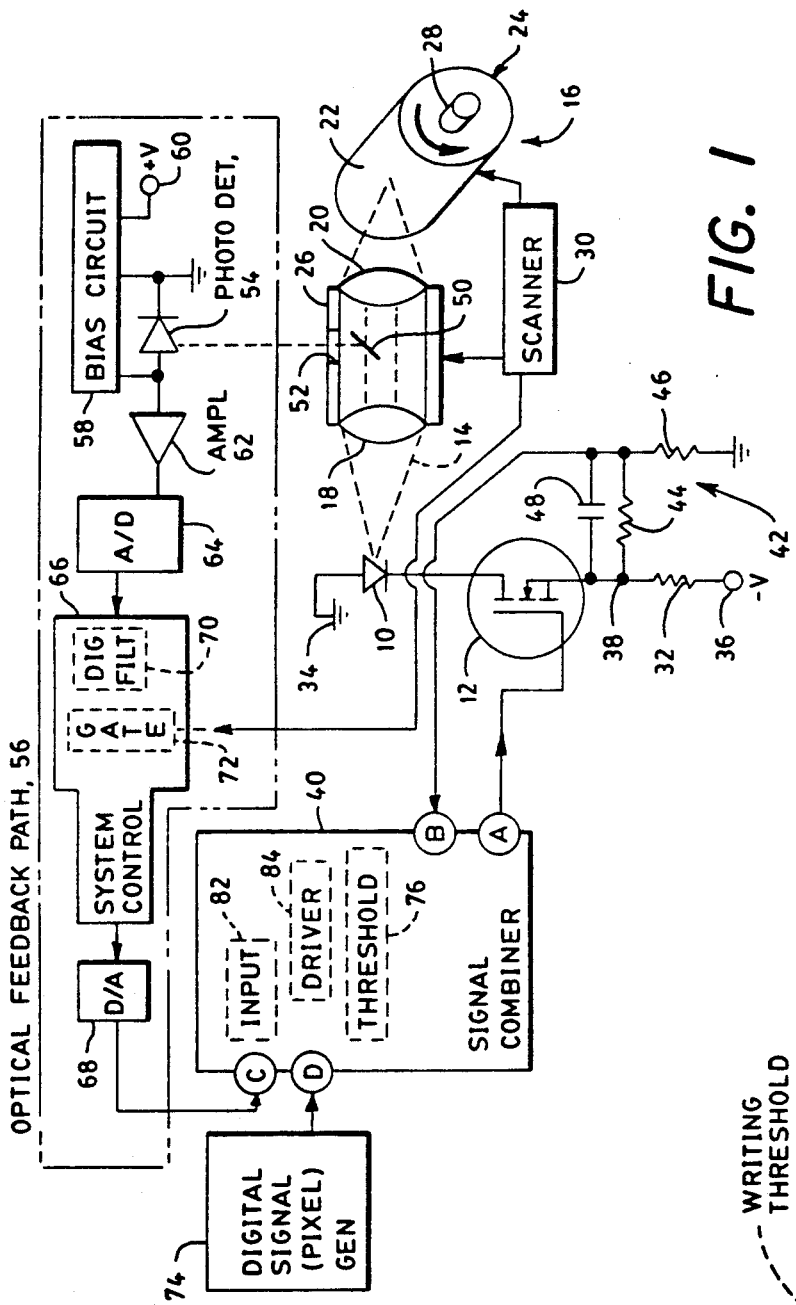
FIG. 1 is a block diagram, partially schematic, of the laser drive circuit of the invention.

In FIG. 1, a laser 10 is constructed as a semiconductor light-emitting diode and is driven with pulses of electric current provided by a field-effect transistor (FET) 12 to produce pulses of radiation. Rays of radiation emitted by the laser 10 are indicated at 14. To demonstrate use of laser 10 in a printing system 16, the rays 14 are focused by lenses 18 and 20 upon a photosensitive recording medium 22 preferably carried upon the cylindrical surface of a rotating drum 24. However, those in the art will recognize that the invention may be used in conjunction with any suitable means for effective relative motion between the medium and lasers. The lenses 18 and 20 are supported within a housing 26, and the drum 24 is supported by a shaft 28 about which the drum 24 rotates. A scanner 30 has connections, indicated diagrammatically, with the housing 26 and the drum 24 for scanning the rays 14 along the medium 22. The scanning may be accomplished by optical means, by mechanical means, or by a combination of both optical and mechanical means. Such scanning is well-known and need not be described further for an understanding of the present invention.

In accordance with the invention, a feedback, or current sensing, resistor 32 is connected in series with the FET 12 and the laser 10 in a series circuit extending between ground 34 and a negative power-supply terminal 36 having a value of $-V$ where V has a magnitude, by way of example, of 12 volts relative to ground. A terminal of the laser 10 is grounded at 34 while a terminal of the resistor 32 connects with the negative terminal 36. In a preferred embodiment of the invention, the resistor 32 has a value of approximately one ohm to provide a sufficient voltage drop for generating a current feedback signal at a junction 38 between the resistor 32 and the FET 12, the value of the resistor 32 being sufficiently small so as to permit adequate current to flow through the laser 10. A drive signal for activating the FET 12 is provided by a signal combiner 40 via terminal A to the gate terminal of the FET 12. The resistor 32 connects with the source terminal of the FET 12, and the laser 10 connects with the drain terminal of the FET 12. The current feedback signal is fed from the junction 38 via a resistive divider network 42 to terminal B of the signal combiner 40. The divider network 42 comprises two resistors 44 and 46 serially connected between the junction 38 and ground. The resistor 44 connects with the junction 38 and is bypassed by a capacitor 48 connected in parallel with the resistor 44. The junction between the resistor 44 and 46 is connected to terminal B of the combiner 40.

A further feedback signal, namely an optical feedback signal, is obtained by sampling a small of the rays 14 by means of a mirror 50 located between the lenses 18 and 20, the mirror 50 reflecting a sample of the intensity of the rays 14 through an aperture 52 in the housing 26 to impinge upon a photodetector 54 constructed as a semiconductor photodiode. The photodetector 54 forms a part of the optical feedback path 56, and produces an electrical signal in response to receipt of rays of radiation from the laser 10. The signal of the photodetector 54 serves as the optical feedback signal and is coupled via the feedback path 56 to terminal C of the signal combiner 40.

The optical feedback path 56 further comprises a bias circuit 58 connected between ground and a positive power-supply terminal 60 for activating the photodetector 54 in a well-known manner with requisite voltage, current and resistive loading. The positive power-supply terminal 60 has a value of $+V$ where V has a magnitude, by way of example, of 12 volts relative to ground. The signal outputted by the photodetector 54 is coupled via an amplifier 62 to an analog-to-digital converter 64, the amplifier 62 providing sufficient power to the photodetector signal for a good signal-to-noise ratio in the operation of the converter 64. Also included in the feedback path 56 is a system controller 66 and a digital-to-analog converter 68. The controller 66 is connected between the two converters 64 and 68, the converter 68 outputting an analog signal from the feedback path 56 to terminal C of the signal combiner 40.

By way of example in the construction of the controller 66, the controller 66 may include a filter 70 to provide for digital filtering of the photodetector signal such as an integrator, the converter 64 converting the photodetector signal from analog format to digital format for operation of the filter 70. Also, if desired, the controller 66 may include a gate 72 driven by a signal from the scanner 30 for updating the value of the signal at terminal C after the imprinting of a specific quantity of data on the medium 22 such as, by way of example, upon completion of the printing of a sheet of the medium 22 in the event that the printing system 16 employs sheets of photosensitive recording medium. Use of the gate 72 permits long-term correction of drift in the radiation characteristics of the laser 10 without allowing for a noticeable shift of image intensity during the imprinting of a single sheet of the photosensitive recording medium.

In accordance with a feature of the invention, digitally formatted signals, from a source of digital data such as a digital signal, or pixel, generator 74, are applied to the signal combiner 40 at terminal D, and serve as command signals for designating the radiating states of the laser 10, as to whether the laser 10 is lasing or not lasing. The signal applied by the generator 74 to terminal D may be referred to as the PIXGEN signals. The PIXGEN signals are coupled via the signal combiner 40 in combination with the feedback signals at terminals B and C to produce a drive signal at terminal A for designating the radiation states of the laser 10. The laser 10 is operated in digital fashion in a state of radiation by lasing action in which the intensity of radiation is sufficient to activate the medium 22 to produce a mark thereon, and in a nonlasing state of radiation in which the intensity of radiation emitted by the laser 10 is below a threshold of radiation intensity for producing the mark on the photosensitive medium 22. A section of the signal combiner 40 is constructed as a threshold circuit 76 for producing a threshold signal which is combined with the digital signal at terminal D so that the drive signal at terminal A includes a threshold component which maintains the laser 10 in the state of reduced radiation intensity, below the threshold of interaction with the photosensitive medium 22, between pulses of intense radiation which produce the marks on the medium 22.

Figure 2:
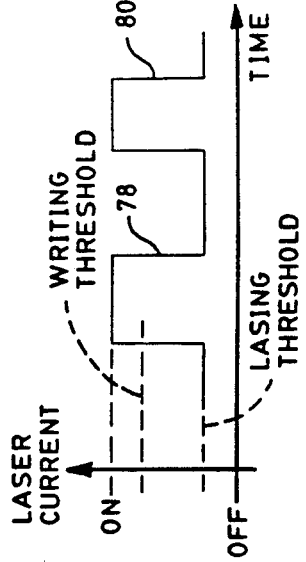
FIG. 2 is a graph showing current pulses for activating a laser of FIG. 1.

Excitation of the laser 10 with current is explained further with the graph of FIG. 2 wherein the horizontal axis represents time, and the vertical axis represents magnitude of current. A value of zero current represents a state in which the laser 10 is completely off. However, in accordance with a feature of the invention, the laser 10 is not turned completely off but, rather, the current between current pulses, such as the pulses 78 and 80, is reduced to a threshold value which permits the laser 10 to radiate at a low-level radiation state wherein the radiation intensity is below the threshold required for interaction with the medium 22 to produce marks thereon,. In particular, it is noted that the threshold current applied to the laser 10 is sufficiently low so that no lasing action occurs in the laser 10, the diode of the laser 10 simply emitting light in the manner of a light-emitting diode. Also shown in FIG. 2 is the writing threshold which is to be exceeded for imprinting marks on the medium 22.

As show in FIG. 2, the amplitude of the pulses 78 and 80 are above the writing threshold to ensure reliable printing of marks on the photosensitive medium 22. By operating the laser 10 at the lasing threshold, immediately below the level at which lasing action occurs, the laser can be more quickly turned on and off. The pulses 78 and 80 represent two pulses of a train of pulses. The durations of the pulses 78 and 80 may differ from each other, and the intervals between pulses of the pulse train of FIG. 2 may vary in accordance with commands of the PIXGEN signal at terminal D. By way of example and without limitation, the digital signal generator 74 may output pulses varying in width in increments of 30 nanoseconds, with a minimum pulse duration and a minimum pulse spacing of 300 nanoseconds. The generator 74 commands the durations and spacings of pulses of current (FIG. 2) and of the corresponding radiation emitted by the diode 10 (FIG. 1) necessary for producing a desired image on the photosensitive recording medium 22. Rise and fall times of the pulses depend in bandwidth of the circuitry of FIGS. 1 and 3, a larger bandwidth providing for a faster rise time and a faster fall time. It is desirable for the rise and the fall times to be less than 40 nanoseconds, a value of 35 nanoseconds being preferred.

The laser 10 is fabricated, in a preferred embodiment of the invention, of a gallium-aluminum-arsenide light-emitting diode producing radiation in the near infrared region of the electromagnetic spectrum. This frequency of radiation is selected to interact with material of the photosensitive medium 22. It is to be understood that radiation of other frequencies, including light of the visible portion of the spectrum, may be employed with other light-emitting diodes to interact with photosensitive media of other composition. The laser outputs a peak power of 500 milliwatts in a preferred embodiment of the invention, through other radiation powers may be employed in the practice of the invention. The amount of current required to generate the foregoing peak power varies during the lifetime of the laser and, near the end of the lifetime, can approach a value of 1.5 amperes in the laser employed in the preferred embodiment of the invention. Thus, it is appreciated that the FET 12 must be capable of supplying considerable power to the laser 10.

The FET 12 is constructed as a metallic-oxide semiconductor field-effect transistor (MOSFET), type IRF521 being employed in the preferred embodiment of the invention. This is a power MOSFET having a maximum DC (direct current) drain current of 8 amperes at a case temperature of 25 Celsius. The input capacitance is non linear and varies with the gate-source voltage. However, good operation of the circuitry is attained by approximating the input capacitance of the FET 12 at 500 picofarads. As will be understood from the ensuing description, the current feedback signal at the junction 38 provides for a rapid-action feedback control loop to ensure a desired amount of current throughout the duration of an individual current pulse. This is based on the measurement of current at the feedback resistor 32. However, the relationship between emitted radiation intensity and the amplitude of the current pulse to the laser 10 varies during the lifetime of the laser, more current being required to produce a given amount of radiated power as the laser ages. Accordingly, the optical feedback signal of the photodetector 54 is employed in a relatively slow acting feedback loop for adjusting the drive signal at terminal A in accordance with aging characteristics of the laser 10. This maintains uniformity of intensity of illumination of the photosensitive recording medium 22 by the rays 14 of the laser 10.

Figure 3:
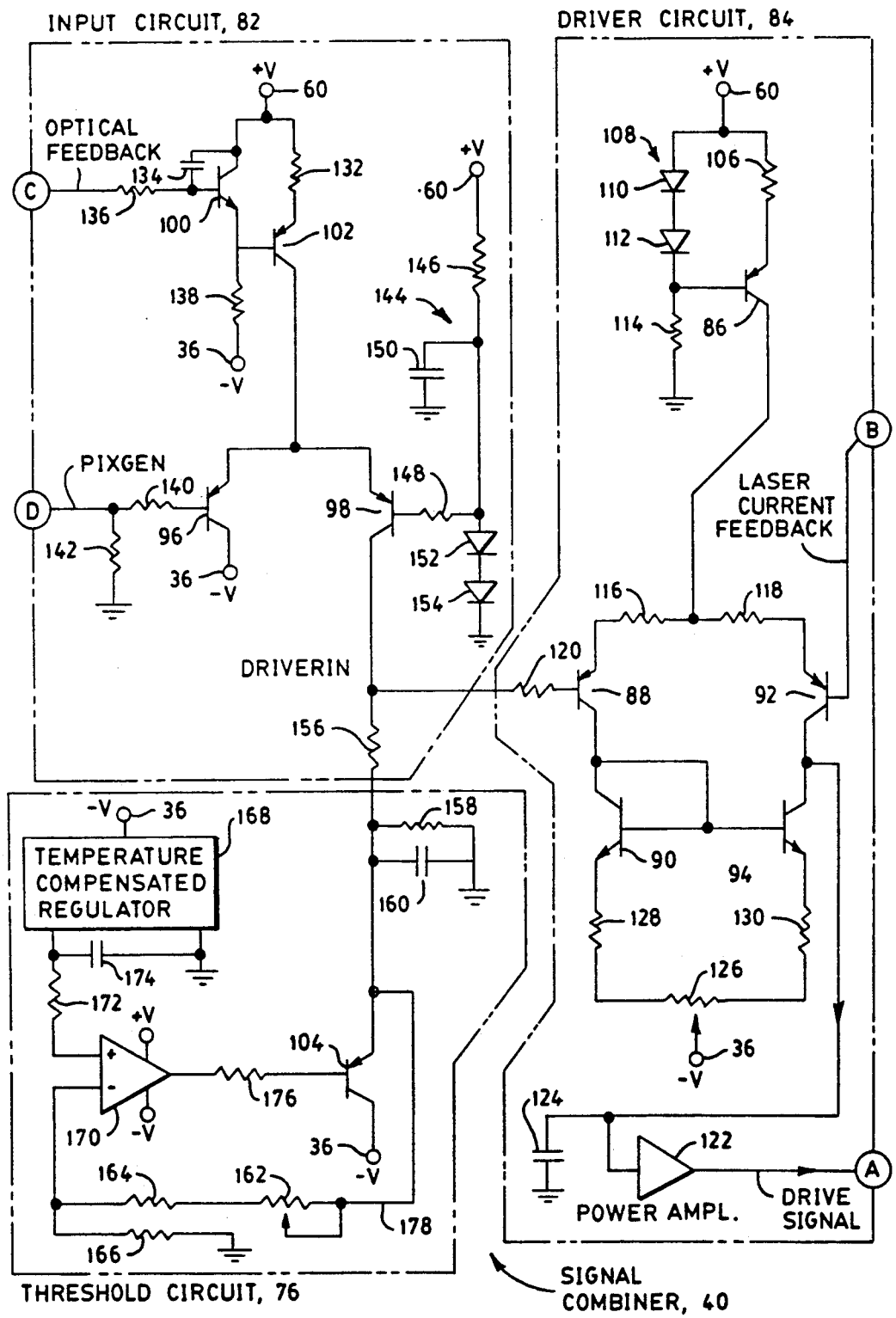
FIG. 3 is a schematic diagram of electrical circuitry of a signal combiner of FIG. 1.

FIG. 3 shows details in the construction of the circuitry of the signal combiner 40. To facilitate the description of the combiner 40, the combiner is divided into three sections, the first section being an input circuit 82, the second section being a driver circuit 84, and the third section being the aforementioned threshold circuit 76. The driver circuit 84 comprises five transistors 86, 88, 90, 92, and 94; the input circuit 82 comprises four transistors 96, 98, 100, and 102; and the threshold circuit 76 comprises one transistor 104. In the driver circuit 84, the four transistors 88, 90, 92 and 94 are arranged as a differential amplifier with the transistors 88 and 90 forming a left branch and the transistors 92 and 94 forming a right branch. The transistor 88 and 92 are type PNP and the transistors 90 and 94 are type NPN. The transistor 86 is type NPN, and serves as a current source for supplying current to the differential amplifier of the transistors 88, 90, 92, and 94. The emitter terminal of transistor 86 is connected by a resistor 106 to the positive-power supply terminal 60 to receive a positive voltage. A base current bias supply 108 for the transistor 86 comprises two diodes 110 and 112 and a resistor 114. The two diodes 110 and 112 are serially connected between the terminal 60 and a terminal of the resistor 114, the opposite terminal of the resistor 114 being grounded. A junction of the diode 112 with the resistor 114 is connected to the base terminal of the transistor 86.

In the differential amplifier configuration of the transistors 88, 90, 92, and 94, the emitter terminals of the transistors 88 and 92 are connected together by serially connected resistors 116 and 118, a junction of the resistors 116 and 118 being connected to the collector terminal of the transistor 86. In the left branch of the differential amplifier, the base terminal of the transistor 88 is connected via a resistor 120 to the input circuit 82 to receive a signal which may be referred to as the DRIVERIN signal. In the right branch of the differential amplifier, the base terminal of the transistor 92 is connected to terminal B of the signal combiner 40. In the left branch, the collector terminal of the transistor 88 is connected to the collector terminal of the transistor 90, and also to base terminals of both of the transistors 90 and 94. In the right branch, the collector terminal of the transistor 92 is connected to the collector terminal of the transistor 94, and is also connected to an input terminal of a power amplifier 122 which outputs the drive signal at terminal A. The input terminal of the power amplifier 122 is connected to ground through capacitor 124.

The driver circuit 84 further comprises a potentiometer 126 having one end terminal connected via a resistor 128 to the emitter terminal of the transistor 90, and a second end terminal connected via a resistor 130 to the emitter terminal of the transistor 94. The mode of interconnection of the transistors 90 and 94 with the transistors 88 and 92 provides the function of a current mirror to the differential amplifier configuration of the driver circuit 84. The potentiometer 126 has a sliding contact connected to the negative power-supply terminal 36 to receive a voltage of —V the sliding contact of the potentiometer 126 being positioned to adjust the voltage offset of the differential amplifier. The resistors 1289 and 130 cooperate with the potentiometer 126 in compensating for differences in the base-emitter voltage drop in the transistors of the differential amplifier.

In the input circuit 82, the transistors 100 and 102 serve as a current source for applying current to the transistors 96 and 98 which are connected in the configuration of a differential amplifier. In the current source, the transistor 100 is type NPN, and the transistor 102 is type PNP. The emitter terminal of the transistor 100 connects with the base terminal of the transistor 102. The collector terminal of the transistor 100 connects with the positive power-supply terminal 60, the terminal 60 also being connected via a resistor 132 to the emitter terminal of the transistor 102. The base terminal of the transistor 100 is connected via a capacitor 134 to the terminal 60. The base terminal of the transistor 100 is also connected via a resistor 136 to terminal C of the signal combiner 40 for receiving the optical feedback signal. The junction of the emitter terminal of the transistor 100 with the base terminal of the transistor 102 is connected via a resistor 138 to the negative power-supply terminal 36.

In the differential amplifier portion of the input circuit 82, the base terminal of the transistor 96 is grounded via serially connected resistors 140 and 142. A junction of the resistors 140 and 142 is connected to terminal D of the signal combiner 40 for receiving the PIXGEN signal. Both of the transistors 96 and 98 are type PNP, and have their collector terminals connected together and to the collector terminal of the transistor 102. A base current bias supply 144 supplies base current to the transistor 98. The bias supply 144 comprises two resistors 146 and 148 serially connected between the positive power-supply terminal 60 and the base terminal of the transistor 98. A junction of the two resistors 146 and 148 is connected via a capacitor 150 to ground, and via serially connected diodes 152 and 154 to ground. The collector terminal of the transistor 96 is connected to the negative power-supply terminal 36. The collector terminal of the transistor 98 is connected via a resistor 156 to the threshold circuit 76 and, via the aforementioned resistor 120, applied the DRIVERIN signal to the transistor 88 of the driver circuit 84.

In the operation of the input circuit 82, the transistor 100 supples current via the base terminal of the transistor 102 to activate the transistor 102 to provide current to the transistors 96 and 98 of the differential amplifier. Current provided by the current source of the transistors 100 and 102 splits between the left branch of the differential amplifier, namely the transistor 96, and the right branch of the differential amplifier, namely, the transistor 98. The splitting of current between the two branches depends on the voltages and currents applied to the base terminals of the transistors 96 and 98. In accordance with the invention, the digitally formatted command signal (the PIXGEN signal) applied to terminal D has sufficient amplitude to turn the transistor 96 on, when the PIXGEN signal is at a relatively low voltage, and off when the PIXGEN signal is at a relatively high voltage. Thereby, the differential amplifier of the transistors 96 and 98 is operated in a switching mode wherein current either flows or does not flow in the left branch. As a result, the current flowing in the right branch is essentially independent of the amplitude of the digital command signal at terminal D. This is in accordance with a feature of the invention wherein the signal combiner 40 serves to compensate for any variations in the amplitude of the digital command signal to provide precisely defined pulses in the drive signal at terminal A of the combiner 40. In contrast, in the driver circuit 84, the differential amplifier configuration of the transistors 88, 90, 92, and 94 operates in a linear mode.

In the input circuit 82, current flowing in the right branch of the differential amplifier flows primarily through the resistor 156 into the threshold circuit 76. A small portion of the current also flows through the resistor 120 into the transistor 88. The current flowing through the resistor 156 develops a voltage drop which appears as an input signal to the transistor 88.

The threshold circuit 76 comprises a resistor 158 which connects with the resistor 156 of the input circuit 82, and a capacitor 160 connected between ground and the junction of the resistors 156 and 158. The junction of the resistors 158 and 160 is also connected to the emitter terminal of the transistor 104, and also to ground by a voltage divider circuit comprising three serially connected elements, namely, a potentiometer 162, a resistor 164, and a further resistor 166. The transistor 104 is type PNP, the collector terminal of the transistor 104 being connected to the negative power-supply terminal 36. Also included within the threshold circuit 76 is a temperature compensated voltage regulator 168, and a differential amplifier 170. The regulator 168 is connected between the negative power-supply terminal 36 and ground. An output terminal of the regular 168 is connected via a resistor 172 to a positive input terminal of the amplifier 170, and is also connected via a capacitor 174 to ground. The amplifier 170 has power supply terminals connected to the power supply terminals 36 and 60 for receiving the voltages, respectively, $-V$ and $+V$. the power supply terminals of the amplifier 170 are also grounded via capacitors. An output terminal of the amplifier 170 is connected via a resistor 176 to the base terminal of the transistor 104. The negative input terminal of the amplifier 170 is connected to the junction of the resistors 164 and 166. A sliding terminal of the potentiometer 162 is connected to an end terminal thereof to form a variable resistance controllable by positioning the sliding terminal.

In the operation of the threshold circuit 76, the regulator 168 outputs a reference voltage to the differential amplifier 170, the amplifier 170 being responsive to the reference voltage for supplying base current via the resistor 176 to the transistor 104. Current from the collector terminal of the transistor 98 flows via the resistor 156 into the transistor 104, and additional current flows from ground through the resistor 158 into the transistor 104. The current in the transistor 104 flows into the negative power-supply terminal 36. Precise control of the current in the transistor 104 is provided by means of a feedback path 178 to the negative input terminal of the amplifier 170, the feedback path 178 including the potentiometer 162. Adjustment of the resistance of the potentiometer 162 alters the voltage fed back to the amplifier 170 for adjustment of the base current provided by the amplifier 170 to the transistor 104. Thereby, the potentiometer 162 serves as means by which a person operating the printing system 16 (FIG. 1) can adjust the threshold current level to a value slightly below the lasing threshold disclosed in the graph of FIG. 2. Since the voltage drop across the resistor 156 is dependent, in part, upon the current in the transistor 98, and in part upon the current in the resistor 158, the voltage applied to the resistor 120 is based, in part, upon the setting of the threshold circuit 76. Thereby, the base current applied to the transistor 88 of the driver circuit 84 includes a component established by the threshold circuit 76.

With respect to the operation of the signal combiner 40, the optical feedback signal at terminal C serves to adjust the peak-to-peak value of the pulse-train signal outputted by the power amplifier 122 at terminal A for driving the FET 12 (FIG. 1). The train of pulses provided by the signal generator 74 at terminal D (the PIXGEN signal) establishes the durations of the individual pulses and the lengths of intervals between the pulses in the drive signal at terminal A. The drive signal at terminal A includes the value of threshold, established by the potentiometer 162, and present between pulses of the drive signal. The power amplifier 122 has the capacity to deliver large amounts of current very quickly to the gate terminal of the FET 12 for charging the input capacitance of the FET 12. The power amplifier 122 is type LM6321N, and has a voltage gain of unity.

In the driver circuit 84, due to the differential configuration of the amplifier, the DRIVERIN signal produces a positive contribution to the drive signal outputted by the amplifier 122, and the feedback signal (terminal B) at the base terminal of the transistor 92, produces a negative contribution to the drive signal outputted by the amplifier 122.

In the circuit of the FET 12 (FIG. 1), the divider network 42 couples essentially one-half of the voltage drop appearing across the feedback resistor 32 to terminal B via the current feedback signal. The voltage drop appearing across the feedback resistor 32 is double the voltage of the drive signal at terminal A. To facilitate description of the pulse train signal at terminal A, the peak value of the pulse signal may be referred to as a high voltage, and the value of the voltage between pulses may be referred to as a low voltage. The DRIVERIN signal has a value of approximately $-6$ volts to bring the signal at terminal A to a low value at which time the voltage at terminal A would be at $-12$ volts. This would produce zero current in the FET 12 and zero voltage drop across the feedback resistor 32. An input voltage to the FET 12 of value $-5.5$ volts produces a current of one ampere in the FET 12.

In the input circuit 82 of the combiner 40, upon the presence of a voltage (PIXGEN signal) at the base terminal of transistor 96, which is lower than the corresponding voltage of transistor 98, current flows through transistor 96, and transistor 98 is cut off. The DRIVERIN signal has a voltage equal to that outputted by the threshold circuit 76. However, when the voltage at the base terminal of transistor 96 is high, the transistor 96 is cut off and all of the current of transistor 102 flows through transistor 98. This causes a voltage drop across the resistor 156, with the difference in voltage between the high and the low values of the voltage, at the DRIVERIN signal, being established by the optical feedback signal at terminal C. The base terminal of transistor 98 is biased to a DC voltage of $+1.2$ volts, this being approximately in the mid-range of the normal voltage swing, for example, in a TTL (transistor-transistor logic) circuit. By way of example, the signal generator 74 may be constructed of TTL circuitry.

In the driver circuit 84 of the combiner 40, transistor 86 provides a current of approximately 10 milliamperes. The transistors 86, 88, and 92 are type MPSH81, and have a frequency response of approximately 600 megahertz (MHz) at a collector current of 5 milliamperes. The use of the current mirror of transistors 90 and 94 increases the DC gain and facilitates control of the unity-gain crossover point. In addition, use of the current mirror doubles the transconductance of the differential amplifier. The potentiometer 126 has a value of approximately 50 ohms. The resistors 128 and 130 increase the output resistance of the current source, ensuring a higher, more controllable DC gain.

The resistors 116 and 118 provide emitter degeneration for the differential pair, this reducing the open-loop DC gain of the amplifier. With respect to loop stability, the zero-gain crossover point of the amplifier is obtained with a larger phase margin by virtue of the resistors 116 and 118. The value of the capacitor 124 can be retained at approximately 5 picofarads because of the emitter degeneration provided by the resistors 116 and 118 in control of the loop dynamics of the current feedback loop. The resistors 116 and 118 also reduce the input capacitance presented by the transistors 88 and 92. This improves stability of the amplifier. Also, the power amplifier 122 has a bandwidth of approximately 50 MHz and a maximum output current of 300 milliamperes. This high current is required for driving the input capacitance of the FET 12. Due to these relatively large currents and the rapid rates of change in these currents, it is advisable to decouple power supplies from the amplifier so as to prevent the entry of switching transients in the power supply lines. The closed loop gain of the current feedback loop employing terminals A and B has a value of 2 which allows for control of the loop dynamics at high frequencies while providing for stability of the loop. The feedback capacitor 48 (FIG. 1) compensates for the input capacitance of the transistor 92 (FIG. 3).

In the input circuit 82 of the combiner 40, the circuitry of the current source comprising the transistors 100 and 102 operates to provide for temperature compensation of the current. The regulator 168 produces −5 volts which is temperature compensated with a temperature coefficient of approximately 0.5 millivolts per degree Celsius. The threshold voltage produced at the emitter terminal of the transistor 104 is approximately −6 volts, this allowing the current from the transistor 98 to flow through the transistor 104 to the power supply terminal 36. The transistor 102 is type 2N3906, and the transistor 100 is type 2N3904. Also, the transistors 96 and 98 are type 2N3906.

In the driver circuit 84 (FIG. 3), the diodes 110 and 112 are type 1N914. The resistor 106 has a value of 68 ohms. The resistor 114 has a value of 10 kilohms. The resistors 116 and 118 each have a value of 430 ohms. The resistors 120, 128 and 130 have values respectively, of 47 ohms, 22 ohms, and 22 ohms. The transistors 90 and 94 are type MPSH10. In FIG. 1, the resistors 44 and 46 each have a value of 100 ohms, and the capacitor 48 has a value of 5 picofarads.

In the input circuit 82 (FIG. 3), the resistors 136, 138 and 132 have values, respectively, of 1000, 2200, and 220 ohms. The resistors 142, 140, 148 and 146 have values of resistance, respectively, of 47, 33, 33, and 22,000 ohms. The diodes 152 and 154 are type 1N914. The capacitors 134 and 150 each have a value of 0.01 microfarads. The resistor 156 has a value of 47 ohms. In the threshold circuit 76, the resistor 158 has a value of 1000 ohms. The capacitor 160 has a value of 3.3 microfarads. The resistor 172 has a value of 22,000 ohms, and the capacitor 174 has a value of 3.3 microfarads. The resistors 166, 164, and 176 have resistance values, respectively, of 22,000, 2200, and 1000 ohms. The potentiometer 162 has a value of 5 kilohms.

The foregoing circuitry provides for rapid and precise control of current pulses applied to a field-effect transistor, the latter serving to apply current pulses to a laser constructed as a semiconductor diode. Two feedback loops responsive to laser current flow and to laser light output provide feedback signals which are combined with a digitally formatted command signal for both short term and long term control of laser light output. The circuitry stabilizes the values of the command signal, and also introduces a threshold to the laser current for maintaining a low level of radiation from the laser, below the lasing level, during intervals between pulses of radiation emitted by the laser.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A laser driver circuit comprising
a laser constructed as a diode, and a field-effect transistor (FET) for applying current to the laser;
current feedback means serially connected with said laser and said FET for signaling an amount of current flow in said laser;
optical feedback means optically coupled to said laser for signaling an amount of radiation emitted by said laser; and
combining means for combining an input digital command signal with a signal of said current feedback means and with a signal of said optical feedback means to provide a drive signal for activating said FET to apply the current to said laser.

2. A laser driver circuit comprising
a laser constructed as a diode, and a field-effect transistor (FET) for applying current to the laser;
current feedback means serially connected with said laser and said FET for signaling an amount of current flow in said laser;
optical feedback means optically coupled to said laser for signaling an amount of radiation emitted by said laser;
combining means for combining an input digital command signal with a signal of said current feedback means and with a signal of said optical feedback means to provide a drive signal for activating said FET to apply the current to said laser; and
wherein said optical feedback means operates with a response time, and said current feedback means operates with a response time many times faster than the response time of said optical feedback means.

3. A laser driver circuit comprising
a laser constructed as a diode, and a field-effect transistor (FET) for applying current to the laser;
current feedback means serially connected with said laser and said FET for signaling an amount of current flow in said laser;
optical feedback means optically coupled to said laser for signaling an amount of radiation emitted by said laser;
combining means for combining an input digital command signal with a signal of said current feedback means and with a signal of said optical feedback means to provide a drive signal for activating said FET to apply the current to said laser; and
wherein said combining means comprises
an input section for receiving the digital command signal and the signal of said of said optical feedback means; and
a driver section coupled to an output terminal of said input section and to an output terminal of said current feedback means, each of said input and said driver sections comprising a current source and a differential amplifier powered by said current source, the differential amplifier having two branches;

wherein, in said input section, the optical feedback signal activates said current source, the digital command signal is applied to a first branch of said differential amplifier, a second branch of said differential amplifier connects with the output terminal of said input section, and the drive signal for activating said FET is provided by the second branch of said differential amplifier; and wherein, in said driver section, the output terminal of said input section connects with a first branch of said differential amplifier, and said current feedback signal is applied to a second branch of said differential amplifier.

4. A circuit according to claim 3 wherein the differential amplifier of said driver section comprises a current mirror circuit.

5. A circuit according to claim 3 wherein said combining means further comprises a threshold section coupled to the second branch of the differential amplifier of said input section for establishing a threshold signal level in said drive signal outputted by the second branch of the differential amplifier of said driver section.

6. A circuit according to claim 3 wherein said optical feedback means comprises a photodetector of the radiation emitted by said laser, means for digitally filtering a signal outputted by said photodetector to provide a filtered photodetector signal, and means for converting said filtered photodetector signal to an analog-formatted signal which serves as the feedback signal of said optical feedback means; and said current feedback means comprises a feedback resistor serially connected with said laser and said FET, and a resistive voltage divider connecting between said feedback resistor and said combining means for providing said feedback signal of said current feedback means.

7. A circuit according to claim 3 wherein said input section operates in a switching mode in response to said input digital command signal, and said driver section operates in a linear mode.

8. A circuit according to claim 7 wherein
said laser is operative as a part of a laser printer providing for a scanning of the radiation emitted by said laser across a printing medium; and
said optical feedback means outputs its feedback signal in synchronism with operation of the laser printer.

9. A circuit according to claim 8 wherein
said combining means further comprises a threshold section coupled to the second branch of the differential amplifier of said input section for establishing a threshold signal level in said drive signal outputted by the second branch of the differential amplifier of said driver section.

10. A method for driving a laser, the laser being constructed as a diode, the method comprising:
applying current to the laser via a field-effect transistor (FET) serially connected to the laser;
feeding back a current feedback signal representative of the magnitude of current flowing in the laser;
feeding back an optical feedback signal representative of an amount of radiation emitted by the laser; and
combining an input digital command signal with said current feedback signal and with said optical feedback signal to produce a drive signal, said drive signal being employed in said applying step for activating said FET to apply the current to the laser.

11. A method for driving a laser, the laser being constructed as a diode, the method comprising:
applying current to the laser via a field-effect transistor (FET) serially connected to the laser;
feeding back a current feedback signal representative of the magnitude of current flowing in the laser;
feeding back an optical feedback signal representative of an amount of radiation emitted by the laser; and
combining an input digital command signal with said current feedback signal and with said optical feedback signal to produce a drive signal, said drive signal being employed in said applying step for activating said FET to apply the current to the laser;
wherein said combining step is accomplished by use of an input circuit and a driver circuit activated by said input circuit; and
wherein said combining step comprises steps of
coupling said digital command signal and said optical feedback signal to said input circuit;
coupling said current feedback signal to said driver circuit;
operating said input circuit in a switching mode to accommodate changes in the amplitude of said digital command signal; and
operating said driver circuit in a linear mode for producing said drive signal for said FET.

12. A method according to claim 11 wherein said input circuit includes a differential amplifier operating in a switching mode, and
wherein said method further comprises a step of energizing said differential amplifier with current from a current source; and
regulating current of the current source by said optical feedback signal.

13. A method for driving a laser, the laser being constructed as a diode, the method comprising:
applying current to the laser via a field-effect transistor (FET) serially connected to the laser;
feeding back a current feedback signal representative of the magnitude of current flowing in the laser;
feeding back an optical feedback signal representative of an amount of radiation emitted by the laser; and
combining an input digital command signal with said current feedback signal and with said optical feedback signal to produce a drive signal, said drive signal being employed in said applying step for activating said FET to apply the current to the laser;
wherein said combining step is accomplished by use of an input circuit and a driver circuit activated by said input circuit, said optical feedback signal and said current feedback signal constituting a set of two feedback signals of said combining step; and
wherein said combining step comprises steps of
coupling said command signal and one of said feedback signals to said input circuit;
coupling the second of said two feedback signals to said driver circuit;
operating said input circuit in a switching mode to accommodate changes in the amplitude of said digital command signal; and
operating said driver circuit in a linear mode for producing said drive signal for said FET.

14. A laser driver circuit comprising
a laser constructed as a diode, and a field-effect transistor (FET) for applying current to the laser;

current feedback means serially connected with said laser and said FET for signaling an amount of current flow in said laser;

optical feedback means optically coupled to said laser for signaling an amount of radiation emitted by said laser; and combining means for combining an input digital command signal with a signal of said current feedback means and with a signal of said optical feedback means to provide a drive signal for activating said FET to apply the current to said laser;

wherein said combining means comprises a first differential amplifier circuit and a second differential amplifier circuit each of which has a plurality of input terminals and an output terminal, the output terminal of said first differential amplifier circuit being coupled to an input terminal of said second different amplifier circuit, the digital command signal and the optical feedback signal and the current feedback signal constituting a set of three input signals to said combining means, two of said three input signals being applied to input terminals of said first differential amplifier circuit and a third of said three input signals being applied to an input terminal of said second differential amplifier circuit, said drive signal appearing at the output terminal of said second differential amplifier circuit.

15. A laser driver circuit comprising a laser constructed as a diode, and a field-effect transistor (FET) for applying current to the laser;

current feedback means serially connected with said laser and said FET for signaling an amount of current flow in said laser;

optical feedback means optically coupled to said laser for signaling an amount of radiation emitted by said laser; and combining means for combining an input digital command signal with a signal of said current feedback means and with a signal of said optical feedback means to provide a drive signal for activating said FET to apply the current to said laser;

wherein said combining means comprises a first combining circuit operating in a switching mode and a second combining circuit operating in a linear mode, the digital command signal and the optical feedback signal and the current feedback signal constituting a set of three input signals to said combining means, two of said set of three input signals being applied to input terminals of said first combining circuit, an output signal of said first combining circuit and a third of said set of three input signals being applied to said second combining circuit, said drive signal appearing at an output terminal of said second combining circuit.

16. A laser driver circuit according to claim 15 wherein the digital command signal and the optical feedback signal are applied to said first combining circuit.

* * * * *